(12) United States Patent
Cheng

(10) Patent No.: US 12,218,276 B2
(45) Date of Patent: Feb. 4, 2025

(54) SEMICONDUCTOR STRUCTURES AND SUBSTRATES THEREOF, AND METHODS FOR MANUFACTURING THE SAME

(71) Applicant: ENKRIS SEMICONDUCTOR, INC., Jiangsu (CN)

(72) Inventor: Kai Cheng, Suzhou (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 617 days.

(21) Appl. No.: 17/613,479

(22) PCT Filed: Jan. 9, 2020

(86) PCT No.: PCT/CN2020/071182
§ 371 (c)(1),
(2) Date: Nov. 22, 2021

(87) PCT Pub. No.: WO2021/138872
PCT Pub. Date: Jul. 15, 2021

(65) Prior Publication Data
US 2022/0223757 A1 Jul. 14, 2022

(51) Int. Cl.
*H01L 33/06* (2010.01)
*H01L 27/15* (2006.01)
(Continued)

(52) U.S. Cl.
CPC .............. *H01L 33/24* (2013.01); *H01L 27/15* (2013.01); *H01L 33/005* (2013.01); *H01L 33/06* (2013.01)

(58) Field of Classification Search
None
See application file for complete search history.

(56) References Cited

U.S. PATENT DOCUMENTS

| 9,666,757 B2 | 5/2017 | Zeng et al. |
| 2008/0251807 A1* | 10/2008 | Yoon ................. H01L 33/20 257/E33.001 |

(Continued)

FOREIGN PATENT DOCUMENTS

| CN | 1832110 A | 9/2006 |
| CN | 102386291 A | 3/2012 |

(Continued)

OTHER PUBLICATIONS

ISA State Intellectual Property Office of the People's Republic of China, International Search Report Issued in Application No. PCT/CN2020/071182, Oct. 9, 2020, WIPO, 4 pages.

(Continued)

*Primary Examiner* — Bilkis Jahan
(74) *Attorney, Agent, or Firm* — The Small Patent Law Group LLC; Christopher R. Carroll

(57) ABSTRACT

The present disclosure provides a semiconductor structure and substrate thereof, and a method for manufacturing the same. In the method for manufacturing the substrate, at least one of groove is provided in each unit sub-region on a surface of a premanufactured substrate, and the premanufactured substrate includes at least one unit region, each of the at least one unit region includes at least two unit sub-regions; in one of the at least one unit region, the at least two unit sub-regions respectively have different porosities, the premanufactured substrate is annealed to form a substrate, wherein openings of the grooves are healed to form self-healing layers, and the grooves that are not fully healed form gaps. When a susceptor transfers heat to the substrate, the unit sub-regions with different porosities respectively have different heat conduction efficiencies.

20 Claims, 13 Drawing Sheets

(51) Int. Cl.
    *H01L 33/00*     (2010.01)
    *H01L 33/24*     (2010.01)

(56)     References Cited

U.S. PATENT DOCUMENTS

| | | | |
|---|---|---|---|
| 2010/0289052 A1* | 11/2010 | Yoon | H01L 33/20 |
| | | | 257/E33.023 |
| 2013/0280839 A1* | 10/2013 | Sonoda | H01L 33/005 |
| | | | 438/759 |
| 2015/0108534 A1 | 4/2015 | Zeng et al. | |

FOREIGN PATENT DOCUMENTS

| | | |
|---|---|---|
| CN | 103000779 A | 3/2013 |
| CN | 103283306 A | 9/2013 |
| CN | 103545411 A | 1/2014 |
| CN | 104078540 A | 10/2014 |
| CN | 106784194 A | 5/2017 |
| CN | 108400211 A | 8/2018 |
| KR | 20130128745 A | 11/2013 |

OTHER PUBLICATIONS

ISA State Intellectual Property Office of the People's Republic of China, Written Opinion of the International Searching Authority Issued in Application No. PCT/CN2020/071182, Oct. 9, 2020, WIPO, 4 pages. (Submitted with Machine Translation).
State Intellectual Property Office of the People's Republic of China, Office Action and Search Report Issued in Application No. 2020800809999, Sep. 15, 2024, 15 pages. (Submitted with Machine Translation).

\* cited by examiner

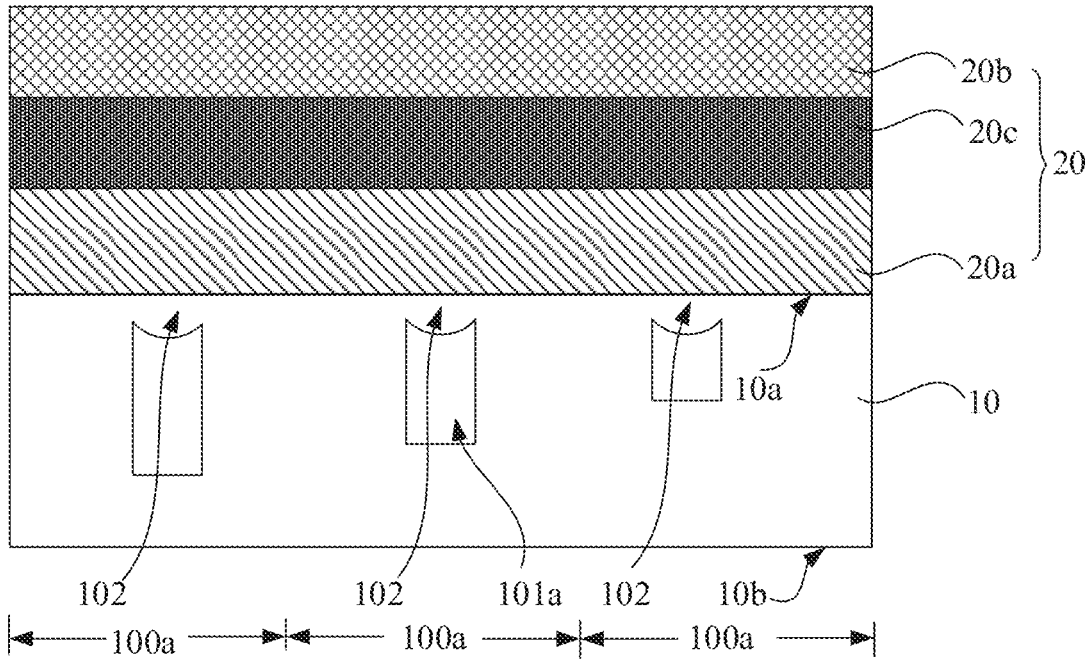

FIG. 2

| Provide a premanufactured substrate, where the premanufactured substrate includes at least one unit region, and each of the at least one unit region includes at least two unit sub-regions; grooves are provided in each unit sub-region on a front surface of the premanufactured substrate, where in one of the at least one unit region, the grooves of various unit sub-regions have different depths | ~S1 |

| Anneal the premanufactured substrate to form a substrate, wherein openings of the grooves are healed to form self-healing layers, and the grooves that are not fully healed form gaps | ~S2 |

| Grow light-emitting layer on a front surface of the substrate, where in one of the at least one unit region, a light-emitting wavelength of the light-emitting layer of each unit sub-region differs | ~S3 |

FIG. 3

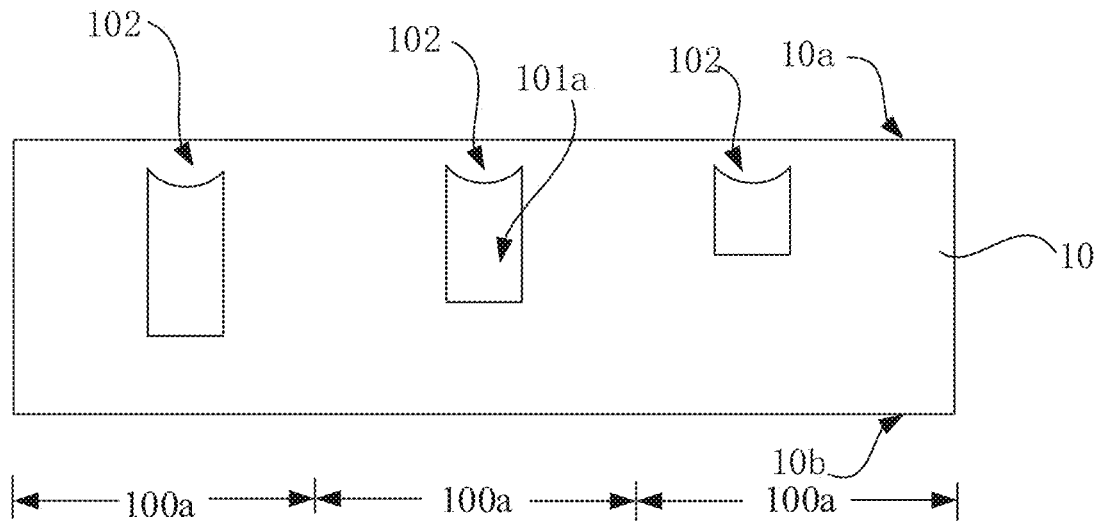

FIG. 7

Provide a premanufactured substrate, where the premanufactured substrate includes at least one unit region, and each of the at least one unit region includes at least two unit sub-regions; grooves are provided in each unit sub-region on a front surface of the premanufactured substrate, where in one of the at least one unit region, the grooves of various unit sub-regions have different depths ~S1

Anneal the premanufactured substrate to form a substrate, wherein openings of the grooves are healed to form self-healing layers, and the grooves that are not fully healed form gaps ~S2

FIG. 8

Provided a premanufactured substrate, where the premanufactured substrate includes at least one unit region, and each of the at least one unit region includes at least two unit sub-regions; grooves are provided in each unit sub-region on a back surface of the premanufactured substrate, where in one of the at least one unit region, the grooves of various unit sub-regions have different depths ~S1'

Anneal the premanufactured substrate to form a substrate, wherein openings of the grooves are healed to form self-healing layers, and the grooves that are not fully healed form gaps ~S2

Grow a light-emitting layer on a front surface of the substrate, where in one of the at least one unit region, a light-emitting wavelength of the light-emitting layer of each unit sub-region differs ~S3

FIG. 10

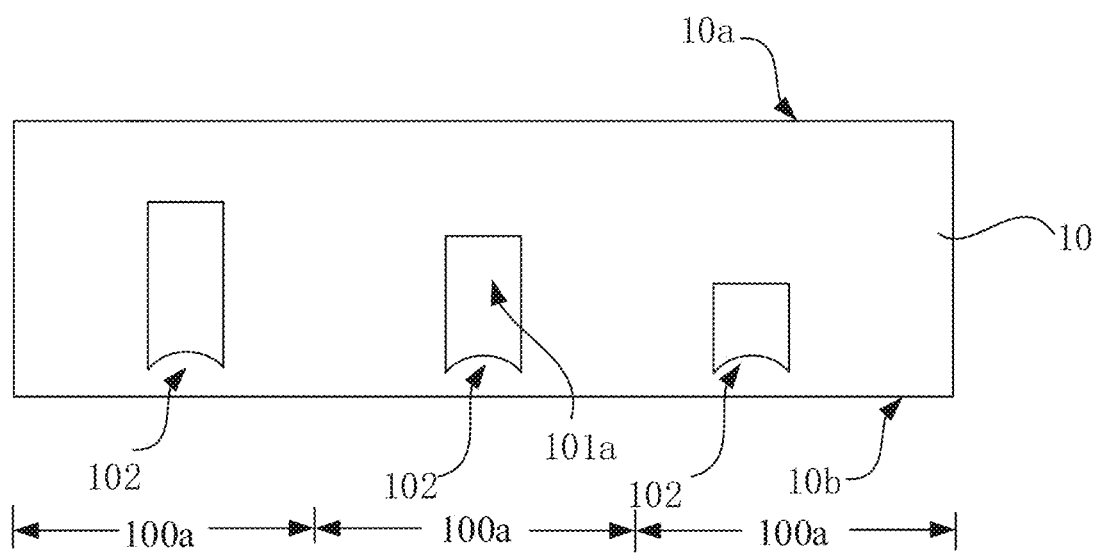

FIG. 11

Provided a premanufactured substrate, where the premanufactured substrate includes at least one unit region, and each of the at least one unit region includes at least two unit sub-regions; grooves are provided in each unit sub-region on a back surface of the premanufactured substrate, where in one of the at least one unit region, the grooves of various unit sub-regions have different depths ~S1'

Anneal the premanufactured substrate to form a substrate, wherein openings of the grooves are healed to form self-healing layers, and the grooves that are not fully healed form gaps ~S2

FIG. 12

Provide a premanufactured substrate, where the premanufactured substrate includes at least one unit region, and each of the at least one unit region includes at least two unit sub-regions; grooves are provided in each unit sub-region on a front surface and a back surface of the premanufactured substrate, where in one of the at least one unit region, the grooves of various unit sub-regions have different depths ——S1"

Anneal the premanufactured substrate to form a substrate, wherein openings of the grooves are healed to form self-healing layers, and the grooves that are not fully healed form gaps ——S2

Grow a light-emitting layer on a front surface of the substrate, where in one of the at least one unit region, a light-emitting wavelength of the light-emitting layer of each unit sub-region differs ——S3

FIG. 14

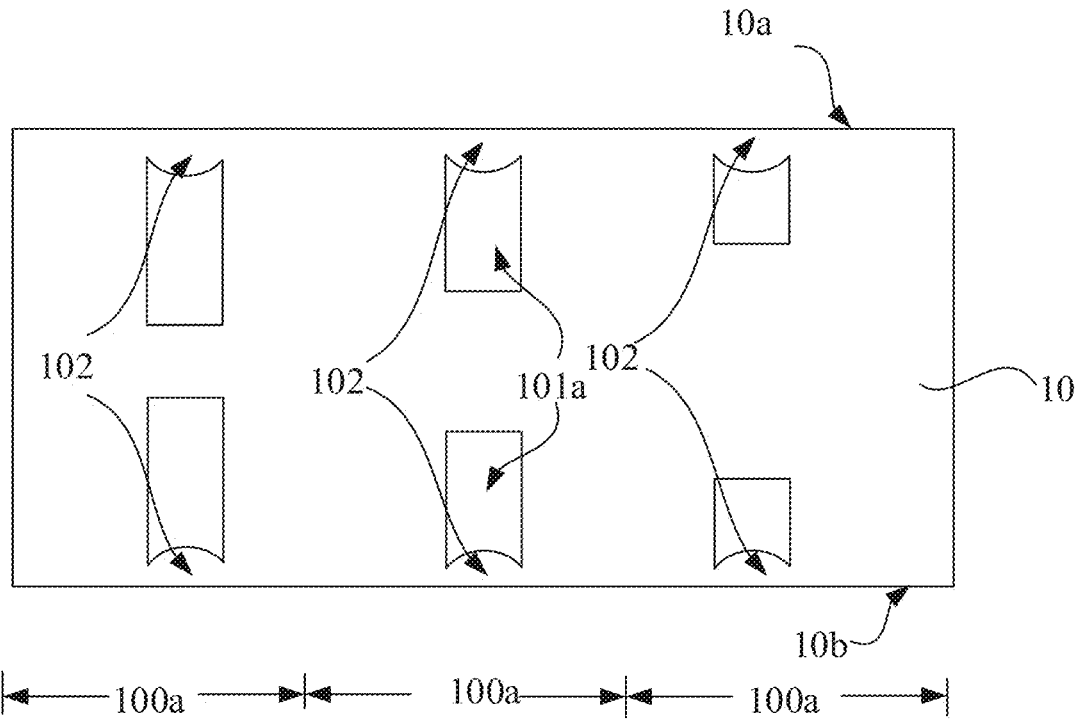

FIG. 15

| Provide a premanufactured substrate, where the premanufactured substrate includes at least one unit region, and each of the at least one unit region includes at least two unit sub-regions; grooves are provided in each unit sub-region on a front surface and a back surface of the premanufactured substrate, where in one of the at least one unit region, the grooves of various unit sub-regions have different depths | S1" |

| Anneal the premanufactured substrate to form a substrate, wherein openings of the grooves are healed to form self-healing layers, and the grooves that are not fully healed form gaps | S2 |

FIG. 16

SEMICONDUCTOR STRUCTURES AND SUBSTRATES THEREOF, AND METHODS FOR MANUFACTURING THE SAME

CROSS-REFERENCE TO RELATED APPLICATIONS

This application is a national phase entry of and claims priority to International Patent Application No. PCT/CN2020/071182 (filed 9 Jan. 2020), the entire disclosure of which is incorporated herein by reference.

TECHNICAL FIELD

The present disclosure relates to the field of semiconductors, and in particular, to a semiconductor structure and substrate thereof, and a method for manufacturing the same.

BACKGROUND

A light-emitting diode is called LED for short and radiates visible light by electron-hole recombination. Two major application fields of LED include illumination and display. Especially in the field of display, the tendency of development in future includes greater image quality and greater definition (more pixels and smaller pixels). The key technology to realize high-definition display is to realize ultra-small light-emitting pixels, and a smaller full-color LED light-emitting unit is needed.

In the related art, an existing full-color LED packaging unit has a size of 1 millimeter (mm) by 1 mm. Horizontal LED chips in red, green, and blue are packaged on a PCB (printed circuit board) through die bonding and wire bonding processes. Then, electrodes of the three types of chips are led out of the PCB from the back side through a conductive through-hole process. Thus, the full-color LED packaging unit is formed. The full-color LED packaging unit is then soldered to a COB (chip on board) through a COB packaging process. A dot matrix LED display is formed through row/column wiring on the COB.

SUMMARY

The present disclosure provides a semiconductor structure and substrate thereof, and a method for manufacturing the same, which are used for a full-color LED to reduce a size and costs of the full-color LED.

To this end, according to a first aspect of the present disclosure, a substrate is provided that includes at least one unit region, where each of the at least one unit region includes at least two unit sub-regions, each of the at least two unit sub-regions has at least one gap and at least one self-healing layer for closing the at least one gap, and the at least two unit sub-regions respectively have different porosities in one of the at least one unit region.

According to the present disclosure, the porosity of the unit sub-region refers to a percentage of a total volume of gaps (or grooves) in a unit sub-region to a volume of a substrate block material of the unit sub-region.

Optionally, in the one of the at least one unit region, the at least one gap in each of the at least two unit sub-regions respectively has different depths and/or different widths, and/or the at least two unit sub-regions respectively have different pore densities.

Optionally, the at least one self-healing layer is coupled to a front surface or a back surface of the substrate.

Optionally, the at least one self-healing layer is coupled to a front surface and a back surface of the substrate.

Optionally, in the one of the at least one unit region, the self-healing layers of some of the at least two unit sub-regions are coupled to a front surface or a back surface of the substrate, and the self-healing layers of some of the at least two unit sub-regions are coupled to the front surface and the back surface of the substrate.

Optionally, the substrate is a patterned substrate.

Optionally, a material of the substrate is at least one of sapphire, silicon, silicon carbide, or a GaN-based material.

According to a second aspect of the present disclosure, provided is a semiconductor structure, which includes:
the substrate according to any one of the above, and
a light-emitting layer disposed on a front surface of the substrate, where a light-emitting wavelength of the light-emitting layer for each of the at least two unit sub-regions differs in the one of the at least one unit region.

Optionally, the light-emitting layer includes an N-type semiconductor layer, a P-type semiconductor layer, and a multi-quantum well material layer disposed between the N-type semiconductor layer and the P-type semiconductor layer.

Optionally, the light-emitting layer includes multiple N-type semiconductor layers and multiple P-type semiconductor layers, where the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

Optionally, the semiconductor structure is used for display, and the light-emitting layer of each of the at least one unit region form a light-emitting unit.

According to a third aspect of the present disclosure, a method for manufacturing a substrate is provided. The method includes:
providing a premanufactured substrate, where the premanufactured substrate includes at least one unit region, and each of the at least one unit region includes at least two unit sub-regions,
providing at least one groove in each of the at least two unit sub-regions on a surface of the premanufactured substrate, where the at least two unit sub-regions respectively have different porosities in one of the at least one unit region, and
annealing the premanufactured substrate to form a substrate, where openings of the grooves are healed to form self-healing layers, and the grooves that are not fully healed form gaps.

Optionally, the at least one groove in each of the at least two unit sub-regions respectively has different depths and/or different widths, and/or the at least two unit sub-regions respectively have different pore densities in the one of the at least one unit region.

Optionally, the at least one groove is provided in each of the unit sub-regions on a front surface or a back surface of the premanufactured substrate.

Optionally, the at least one groove is provided in each of the unit sub-regions on a front surface and a back surface of the premanufactured substrate.

Optionally, the premanufactured substrate is a patterned substrate.

Optionally, a width of each of the at least one groove is less than 100 micrometers (μm).

According to a fourth aspect of the present disclosure, a method for manufacturing a semiconductor structure is provided. The method includes:

manufacturing a substrate by the method according to any one of the above embodiment;

growing a light-emitting layer on a front surface of the substrate, where a light-emitting wavelength of the light-emitting layer for each of the at least two unit sub-regions differs in one of the at least one unit region.

Optionally, the light-emitting layer includes an N-type semiconductor layer, a P-type semiconductor layer, and a multi-quantum well material layer disposed between the N-type semiconductor layer and the P-type semiconductor layer.

Optionally, the light-emitting layer includes multiple N-type semiconductor layers and multiple P-type semiconductor layers, where the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

Optionally, a forbidden bandwidth of the multi-quantum well material layer increases along with the rise of a growth temperature, where the greater the porosity of the unit sub-region is, the longer the light-emitting wavelength of the corresponding light-emitting layer is, and the smaller the porosity of the unit sub-region is, the shorter the light-emitting wavelength of the corresponding light-emitting layer is in the one of the at least one unit region.

Optionally, a method for growing the light-emitting layer includes at least one of atomic layer deposition, chemical vapor deposition, molecular beam epitaxy, plasma enhanced chemical vapor deposition, low pressure chemical vapor deposition, or metal-organic chemical vapor deposition.

Optionally, the semiconductor structure is used for display, and the light-emitting layer of each of the at least one unit region forms a light-emitting unit.

Compared with the related art, the present disclosure has the beneficial effects as below.

1) In the method for manufacturing the semiconductor structure of the present disclosure, grooves are provided in each of the unit sub-regions on a surface of a premanufactured substrate. The premanufactured substrate includes at least one unit region. Each of the unit regions includes at least two unit sub-regions. In one of the at least one unit region, the at least two unit sub-regions respectively have different porosities, the premanufactured substrate is annealed to form a substrate, where openings of the grooves are healed to form self-healing layers, and the grooves that are not fully healed form gaps. When a susceptor transfers heat to the substrate, the unit sub-regions with different porosities respectively have different heat conduction efficiencies. Under the influences of a growth temperature on a luminous property of a multi-quantum well material layer, when a light-emitting layer is grown on a front surface of the substrate, the light-emitting layers with different porosities has different light-emitting wavelengths. The foregoing process is simple. The semiconductor structure for a full-color LED can be manufactured on the substrate, such that a size and costs of the full-color LED are reduced.

2) In optional solutions, a) the light-emitting layer includes an N-type semiconductor layer, a P-type semiconductor layer, and a multi-quantum well material layer disposed between the N-type semiconductor layer and the P-type semiconductor layers. Alternatively, b) the light-emitting layer includes multiple N-type semiconductor layers and multiple P-type semiconductor layers, where the multiple N-type semiconductor layers and the multiple P-type semiconductor layers are disposed alternately, and multi-quantum well material layers are respectively disposed between each of the N-type semiconductor layers and the P-type semiconductor layers adjacent to the N-type semiconductor layer. Comparing with the solution a), the solution b) can improve light-emitting efficiencies of the light-emitting layer.

3) In optional solutions, the semiconductor structure is used for display, and the light-emitting layer respectively grown on each of the unit regions forms a light-emitting unit. Through the foregoing method, a plurality of pixel units distributed in arrays can be manufactured simultaneously. In another optional solutions, a plurality of semiconductor structures for illumination can further be manufactured simultaneously.

BRIEF DESCRIPTION OF THE DRAWINGS

FIG. 2 is a sectional view along the line AA in FIG. 1;

FIG. 3 is a flowchart of a method for manufacturing a semiconductor structure in FIG. 1 and FIG. 2;

FIG. 7 is a sectional view along the line CC in FIG. 6;

FIG. 8 is a flowchart of a method for manufacturing a substrate in FIG. 6 and FIG. 7;

FIG. 10 is a flowchart of a method for manufacturing a semiconductor structure in FIG. 9;

FIG. 11 is a cross-sectional schematic structural diagram of a substrate according to a fourth the fourth embodiment of the present disclosure;

FIG. 12 is a flowchart of a method for manufacturing a substrate in FIG. 11;

FIG. 14 is a flowchart of a method for manufacturing the semiconductor structure in FIG. 13;

FIG. 15 is a cross-sectional schematic structural diagram of a substrate according to a sixth embodiment of the present disclosure;

FIG. 16 is a flowchart of a method for manufacturing the substrate in FIG. 15.

Figure 1:
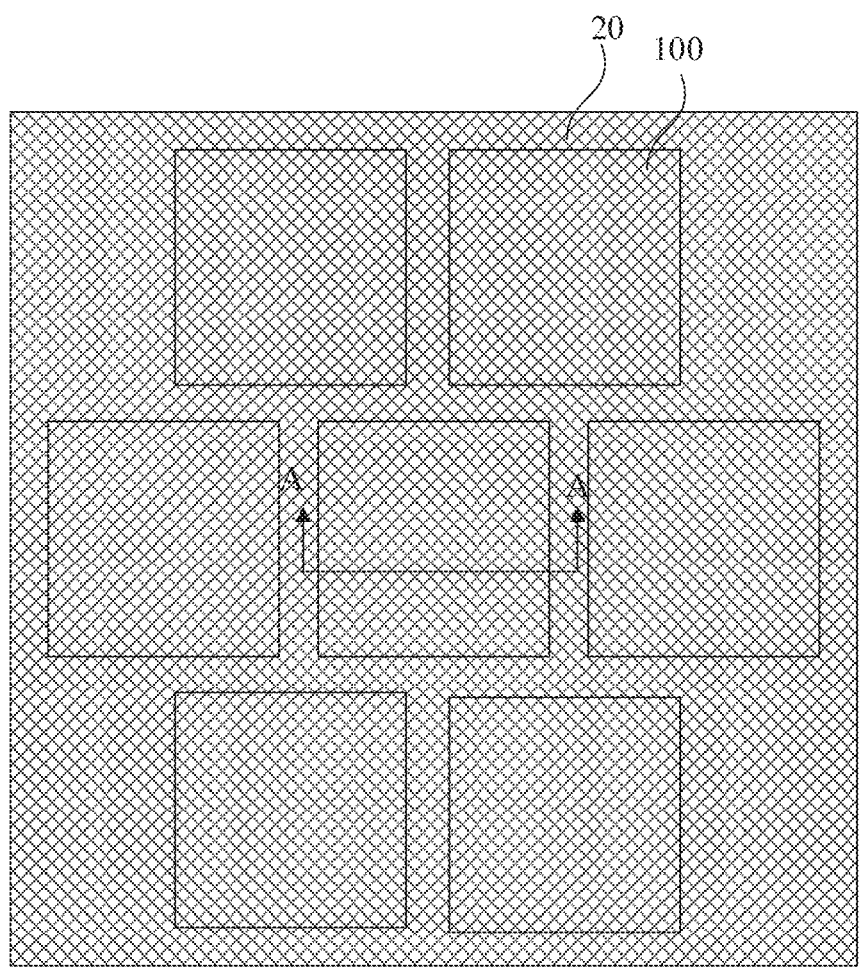
FIG. 1 is a top view of a semiconductor structure according to a first embodiment of the present disclosure.

For the convenience of understanding of the present disclosure, all reference numerals appearing in the present disclosure are listed below.

Substrate 10

Unit region 100

Unit sub-region 100*a*

Back surface 10*b* of a premanufactured substrate or a substrate

Groove 101
Light-emitting layer 20
N-type semiconductor layer 20a
P-type semiconductor layer 20b
Multi-quantum well material layer 20c
Front surface 10a of a premanufactured substrate or a substrate
Gap 101a
Premanufactured substrate 10'
Self-healing layer 102

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

Figure 4:
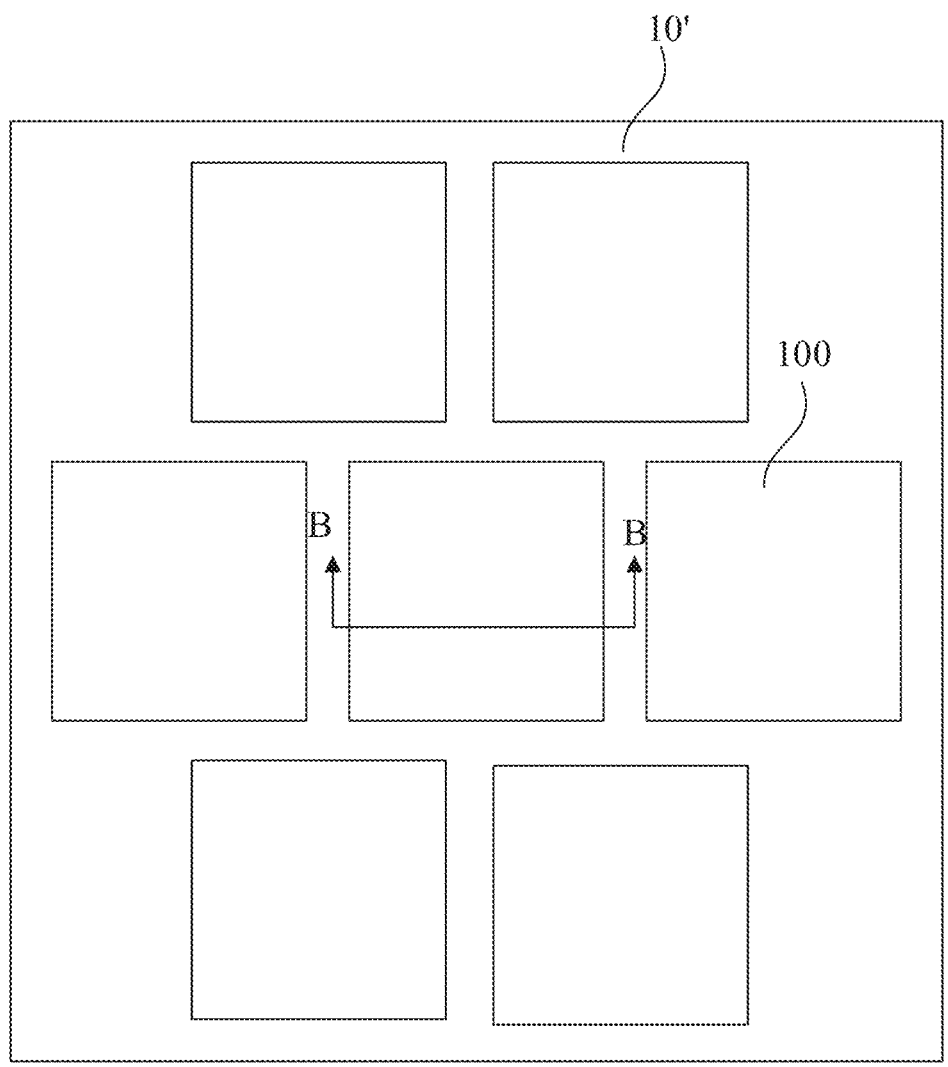
FIG. 4 is a top view of a premanufactured substrate in the flowchart in FIG. 3.
Figure 5:
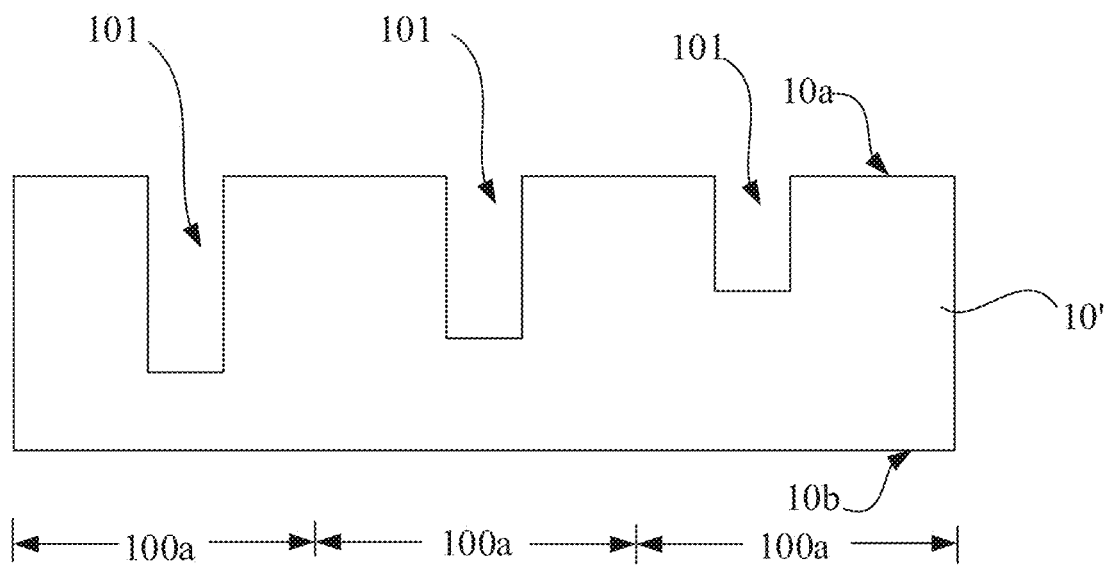
FIG. 5 is a sectional view along the line BB in FIG. 4.

FIG. 1 is a top view of a semiconductor structure according to a first embodiment of the present disclosure. FIG. 2 is a sectional view along the line AA in FIG. 1. FIG. 3 is a flowchart of a method for manufacturing a semiconductor structure in FIG. 1 and FIG. 2. FIG. 4 is a top view of a premanufactured substrate in the flowchart in FIG. 3. FIG. 5 is a sectional view along the line BB in FIG. 4.

Firstly, with reference to step S1 in FIG. 3, FIG. 1, FIG. 2, FIG. 4 and FIG. 5, a premanufactured substrate 10' is provided, where the premanufactured substrate 10' includes at least one unit region 100, and each of the at least one unit region 100 includes at least two unit sub-regions 100a; grooves 101 are provided in each of the unit sub-regions 100a on a front surface 10a of the premanufactured substrate 10', where in one of the at least one unit region 100, the grooves 101 of various unit sub-regions 100a have different depths.

The premanufactured substrate 10' may be sapphire, silicon carbide, silicon, or GaN-based material.

In some embodiments, the premanufactured substrate 10' may be a patterned substrate to improve the quality of the subsequently grown semiconductor layers.

In the embodiment, the semiconductor structure is used for display. The at least one unit region 100 is or are distributed in arrays, with each unit region 100 corresponding to a pixel unit region and each of the unit sub-regions 100a corresponding to a sub-pixel region. At step S1, at least two grooves 101 with different depths are provided in each pixel unit region.

In another embodiments, the semiconductor structure may further be used for illumination. The unit regions 100 are distributed in arrays, with each unit region 100 corresponding to an illumination unit region, each of the unit sub-regions 100a corresponding to a primary-color light-emitting structural region. At step S1, at least two grooves 101 with different depths are provided in each illumination unit region.

In the embodiment as shown in FIG. 2, preferably, there are three grooves 101 corresponding to LED light-emitting structures forming three primary colors red, green, and blue.

The grooves 101 may be formed with methods of dry-etching, laser grooving, mechanical grooving, or the like. In one of the at least one unit region 100, the depth difference between the grooves 101 of various unit sub-regions 100a may be a fixed value or a variable value. The width of the groove 101 is less than 100 μm, for example, 50 μm.

Next, with reference to step S2 in FIG. 3, FIG. 1, FIG. 2, FIG. 4 and FIG. 5, the premanufactured substrate 10' is annealed to form a substrate 10, where openings of the grooves 101 are healed to form self-healing layers 102, and the grooves 101 that are not fully healed form gaps 101a.

After annealing, the self-healing layers 102 close the gaps 101a.

With reference to step S3 in FIG. 3, FIG. 1 and FIG. 2, a light-emitting layer 20 is grown on a front surface 10a of the substrate, where a light-emitting wavelength of the light-emitting layer 20 of each unit sub-region 100a differs in one of the at least one unit region 100.

When the light-emitting layer 20 is growing, a back surface 10b of the substrate is placed on a susceptor in a reaction chamber. A heating device is disposed in the susceptor. The susceptor transfers heat to the substrate 10 to heat the substrate 10 to a growth temperature.

The light-emitting layer 20 includes an N-type semiconductor layer 20a, a P-type semiconductor layer 20b, and a multi-quantum well material layer 20c disposed between the N-type semiconductor layer 20a and the P-type semiconductor layer 20b.

A material of the N-type semiconductor layer 20a, a material of the multi-quantum well material layer 20c, and a material of the P-type semiconductor layer 20b may include at least one of GaN, AlN, InN, InAlGaN, InAlN, GaAs, or AlGaAs. A forming process may include atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or combinations thereof.

Before the N-type semiconductor layer 20a is formed on the substrate 10, a nucleation layer and a buffer layer (not shown in the figures) may further be formed in sequence. A material of the nucleation layer may include, for example, AlN, AlGaN, or the like. A material of the buffer layer may include at least one of AlN, GaN, AlGaN, or AlInGaN. A method for forming the buffer layer may be the same as a method for forming the N-type semiconductor layer 20a. The nucleation layer may relieve problems of lattice mismatch and heat mismatch between epitaxially grown semiconductor layers, for example, between the N-type semiconductor layer 20a and the multi-quantum well material layer 20c and between the multi-quantum well material layer 20c and the P-type semiconductor layer 20b. The buffer layer may reduce dislocation density and defect density of the epitaxially grown semiconductor layers and improve crystal quality.

At step S2, in one of at least one unit region 100, the greater the depths of the grooves 101 of the unit sub-region 100a are, the greater the depths of the gaps 101a are, the greater the porosity of the unit sub-region 100a is, the lower the temperature of the front surface 10a of the unit sub-region 100a is; the smaller the depths of the grooves 101 of the unit sub-region 100a are, the smaller the depths of the gaps 101a are, the smaller the porosity of the unit sub-region 100a is, the higher the temperature of the front surface 10a of the unit sub-region 100a is. The light-emitting wavelength of the grown multi-quantum well material layer 20c may vary based on temperature. Specifically, firstly, in a direct bandgap material, the wavelength is in inverse proportion to the width of the bandgap (i.e., forbidden bandwidth). Secondly, the forbidden bandwidth of some semiconductor material has a positive temperature coefficient, that is, when the growth temperature rises, the forbidden bandwidth increases, and therefore the wavelength is in inverse proportion to the temperature; and some semiconductor material has a negative temperature coefficient, that is, when the growth temperature rises, the forbidden bandwidth decreases, and therefore the wavelength is in direct proportion to the temperature. For example, common InGaN is a semiconductor material with a positive temperature coefficient.

The porosity of the unit sub-region 100a refers to a percentage of a total volume of gaps 101a (or grooves 101) in a unit sub-region 100a to a volume of a substrate block material of the unit sub-region 100a.

In some embodiments, the P-type semiconductor layer 20b may be close to the substrate 10, and the N-type semiconductor layer 20a may be away from the substrate 10.

In some embodiments, an electric connection structure that is electrically connected to the N-type semiconductor layer 20a and the P-type semiconductor layer 20b respectively may further be manufactured on the semiconductor structure to form a full-color LED.

In some embodiments, in one of at least one unit region 100, the grooves 101 of various unit sub-regions 100a have different widths, and/or various unit sub-regions 100a have different pore densities, such that the various unit sub-regions 100a have different porosities. The pore density refers to the number of gaps 101a (or grooves 101) in a unit volume of the unit sub-region 100a.

In some embodiments, in one of at least one unit region 100, the grooves 101 of various unit sub-regions 100a have different depths and/or widths, and/or various unit sub-regions 100a have different pore densities, such that the various unit sub-regions 100a have different porosities. For example, depths of grooves 101 of two unit sub-regions 100a are different and widths of the grooves 101 the two unit sub-regions 100a are different from that of another unit sub-regions 100a.

For the semiconductor structure for display, the light-emitting layer 20 grown on each pixel unit region forms a light-emitting unit. For the semiconductor structure for illumination, cutting may further be performed along cutting lines between adjacent illumination unit regions, to form a plurality of illumination units.

In a method for manufacturing a semiconductor structure in the embodiment, grooves 101 are provided in each of the unit sub-regions 100a on the front surface 10a of the premanufactured substrate 10', and the premanufactured substrate 10' includes at least one unit region 100, each of which includes at least two unit sub-regions 100a. In one of the at least one unit region 100, the grooves 101 of each of the at least two unit sub-regions 100a have different depths to control porosities to be different. The premanufactured substrate is annealed to form a substrate, where openings of the grooves are healed to form self-healing layers, and the grooves that are not fully healed form gaps. When a susceptor transfers heat to the substrate 10, the unit sub-regions 100a with different porosities have different heat conduction efficiencies. Under the influences of a growth temperature on a luminous property of the multi-quantum well material layer 20c, when the light-emitting layer 20 is grown on the front surface 10a of the substrate 10, light-emitting wavelengths of the light-emitting layer 20 of the unit sub-regions 100a with different porosities are different. The foregoing process is simple. The semiconductor structure for a full-color LED can be manufactured on the substrate 10. This reduces a size of the full-color LED and reduces costs.

Figure 6:
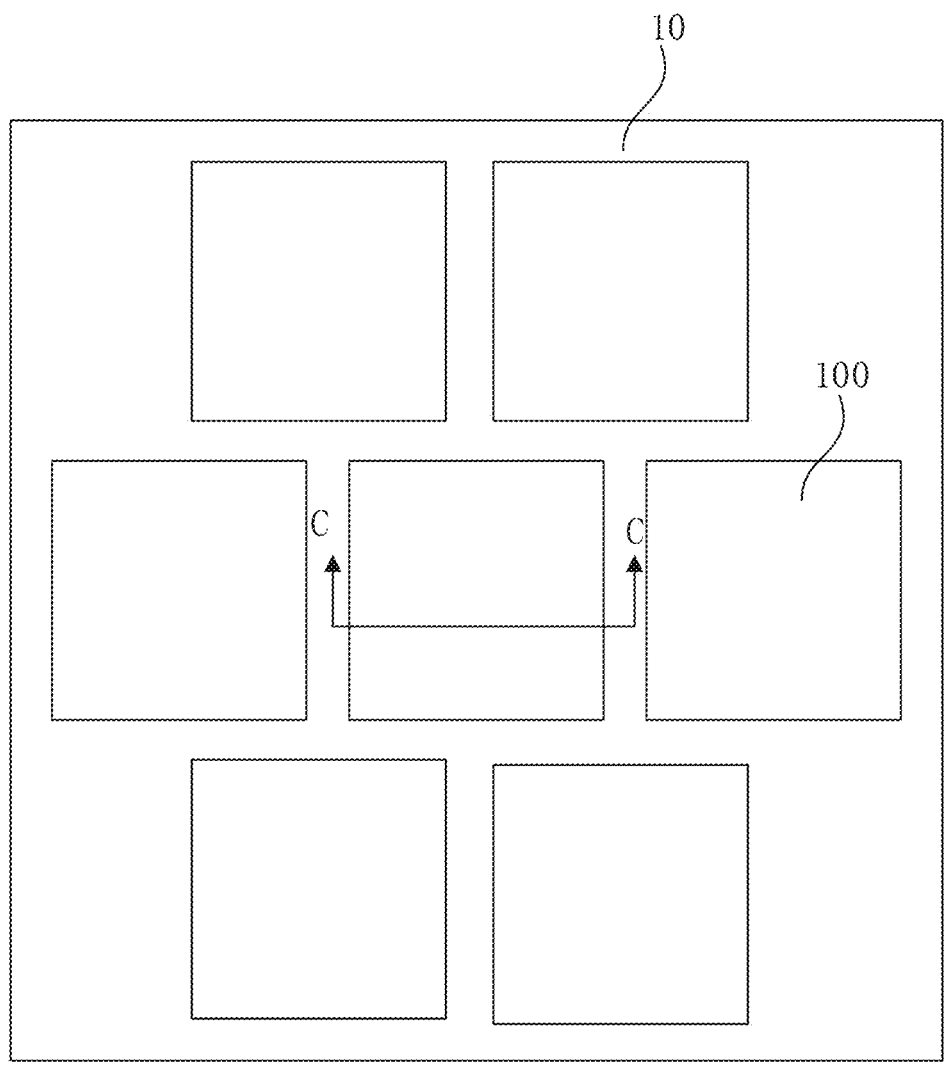
FIG. 6 is a top view of a substrate according to a second embodiment of the present disclosure.

FIG. 6 is a top view of a substrate according to a second embodiment of the present disclosure. FIG. 7 is a sectional view along the line CC in FIG. 6. FIG. 8 is a flowchart of a method for manufacturing a substrate in FIG. 6 and FIG. 7.

With reference to FIG. 6 to FIG. 8, the substrate and the manufacturing method therefor in the second embodiment are completely the same as the substrate and the manufacturing method therefor in the first embodiment. That is, the substrate in the semiconductor structure and the manufacturing method therefor in the first embodiment are introduced into the second embodiment in entirety. The substrate 10 in the semiconductor structure in the first embodiment may be manufactured and marketed separately.

Figure 9:
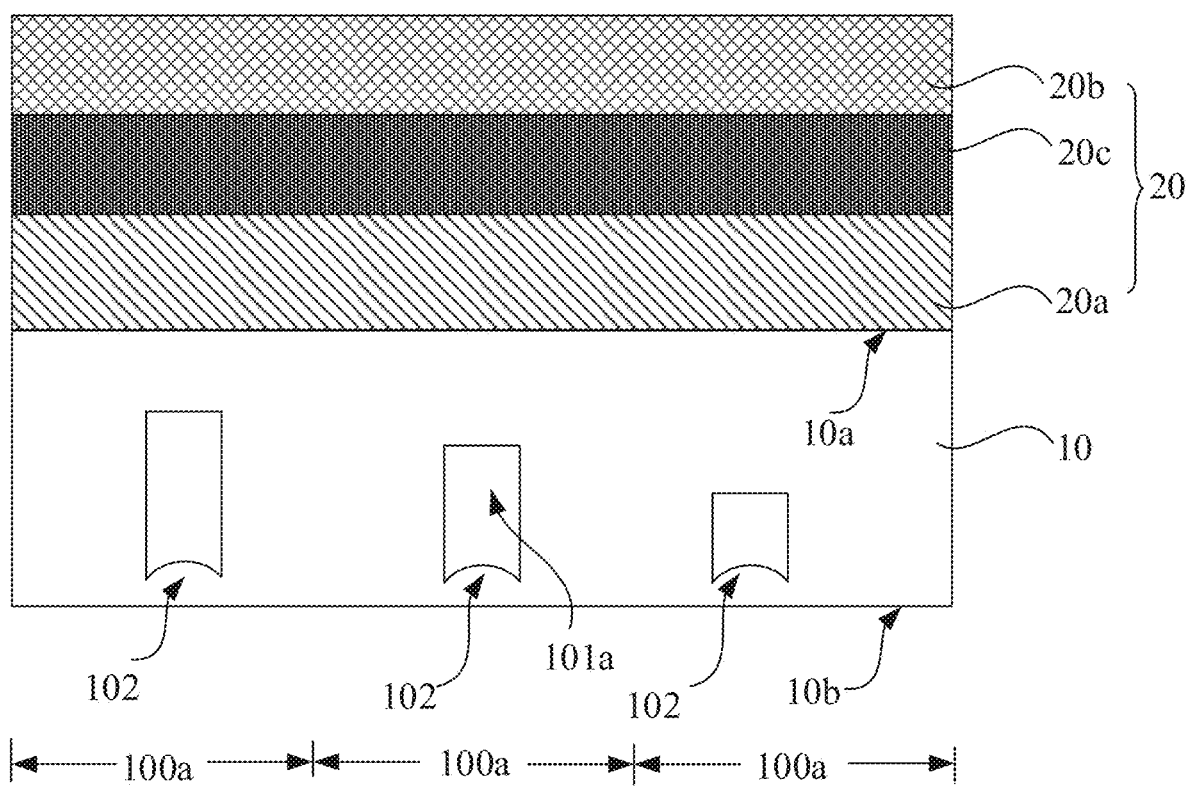
FIG. 9 is a cross-sectional schematic structural diagram of a semiconductor structure according to a third embodiment of the present disclosure.

FIG. 9 is a cross-sectional schematic structural diagram of a semiconductor structure according to a third embodiment of the present disclosure. FIG. 10 is a flowchart of a method for manufacturing a semiconductor structure in FIG. 9.

With reference to FIG. 9, the semiconductor structure in the third embodiment and the semiconductor structure in the first embodiment are substantially the same and only differ in that at least one self-healing layer 102 is coupled to a back surface 10b of a substrate 10.

Accordingly, With reference to FIG. 10, the method for manufacturing the semiconductor structure in the third embodiment and the method for manufacturing the semiconductor structure in the first embodiment are substantially the same and only differ in that: in step S1', grooves 101 are provided on a back surface 10b of a premanufactured substrate 10'.

The grooves 101 of various unit sub-regions 100a have different depths and/or widths, and/or various unit sub-regions 100a have different pore densities, such that the various unit sub-regions 100a have different porosities.

In the third embodiment, when a susceptor transfers heat to the substrate 10, the unit sub-regions 100a with different porosities have different heat conduction efficiencies. For the multi-quantum well material layer 20c with a forbidden bandwidth increasing along with the rise of a growth temperature, (a) the greater the depths of the grooves 101 are, the greater the depths of the gaps 101a are, (b) the greater the porosity of the unit sub-region 100a is, the worse the heat conduction efficiency of the unit sub-region 100a is, and (c) the longer the light-emitting wavelength of the corresponding light-emitting layer 20 is, the smaller the depths of the grooves 101 are, the smaller the depths of the gaps 101a are, the smaller the porosity of the unit sub-region 100a is, the better the heat conduction efficiency of the unit sub-region 100a is, and the shorter the light-emitting wavelength of the corresponding light-emitting layer 20 is.

In some embodiments, in one of the at least one unit region 100, grooves 101 of some unit sub-regions 100a may further be provided on a front surface 10a of a premanufactured substrate 10', grooves 101 of some unit sub-regions 100a are provided on a back surface 10b of the premanufactured substrate 10', and the grooves 101 of various unit sub-regions 100a have different depths and/or widths, and/or various unit sub-regions 100a have different pore densities, such that the various unit sub-regions 100a have different porosities. In other words, in one of at least one unit region 11 of the substrate 10, the self-healing layers 102 of some unit sub-regions 100a are coupled to a front surface 10a of the substrate 10, and the self-healing layers 102 of some unit sub-regions 100a are coupled to the back surface 10b of the substrate 10. Porosities of various unit sub-regions 100a are different.

FIG. 11 is a cross-sectional schematic structural diagram of a substrate according to a fourth embodiment of the present disclosure. FIG. 12 is a flowchart of a method for manufacturing a substrate in FIG. 11.

With reference to FIG. 11 and FIG. 12, the substrate and the manufacturing method therefor in the fourth embodiment are completely the same as the substrate and the manufacturing method therefor in the semiconductor structure in the third embodiment. That is, the substrate in the semiconductor structure and the manufacturing method therefor in the third embodiment are introduced into the fourth embodiment in entirety. The substrate 10 in the semiconductor structure in the third embodiment may be manufactured and marketed separately.

Figure 13:
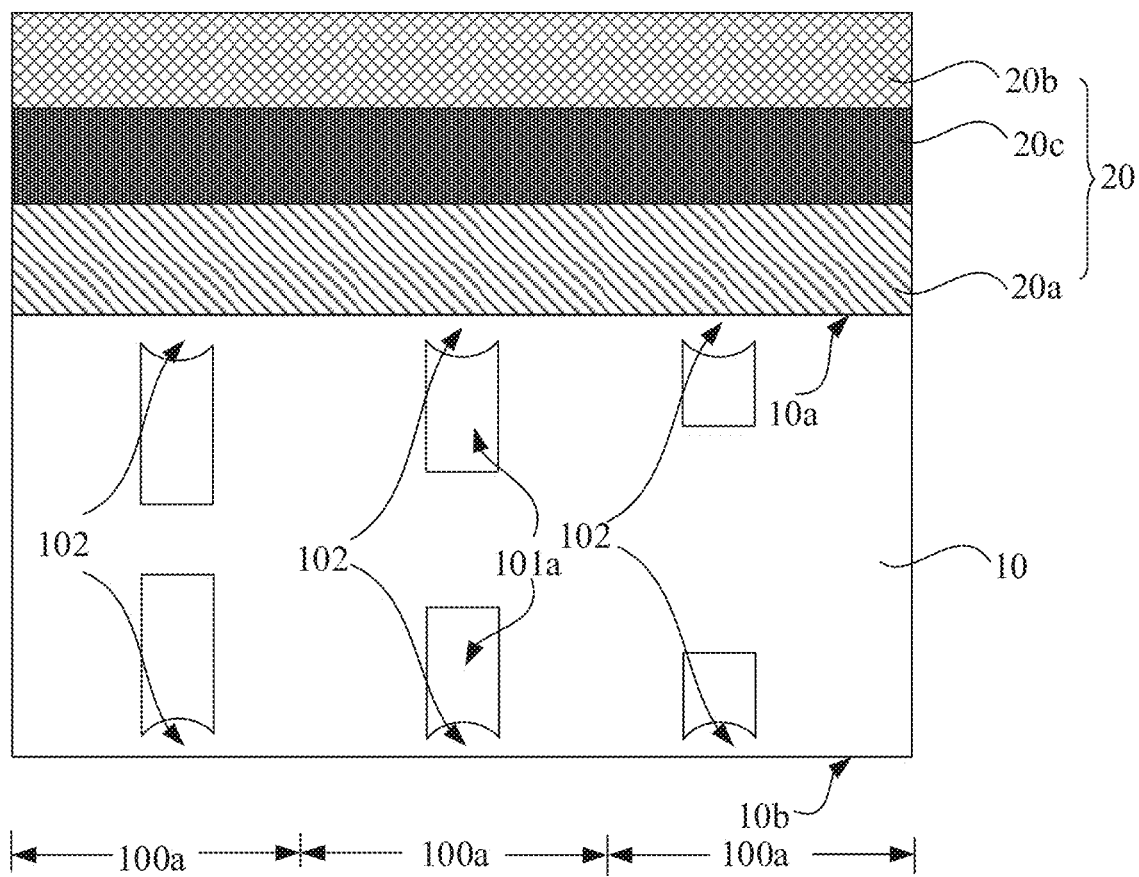
FIG. 13 is a cross-sectional schematic structural diagram of a semiconductor structure according to a fifth embodiment of the present disclosure.

FIG. 13 is a cross-sectional schematic structural diagram of a semiconductor structure according to a fifth embodiment of the present disclosure. FIG. 14 is a flowchart of a method for manufacturing the semiconductor structure in FIG. 13.

With reference to FIG. 13, the semiconductor structure in the fifth embodiment and the semiconductor structures in the first embodiment and the third embodiment are substantially the same and only differ in that: the self-healing layers 102 are coupled to a front surface 10a and a back surface 10b of the substrate 10, and in one of at least one unit region 100, sums of the depths of gaps 101a of various unit sub-regions 100a are different.

Accordingly, with reference to FIG. 14, the method for manufacturing the semiconductor structure in the fifth embodiment and the method in the first embodiment and the third embodiment are substantially the same and only differ in that at step S1", grooves 101 are provided in a front surface 10a and a back surface 10b of the premanufactured substrate 10', and sums of the depths of the grooves 101 of various unit sub-regions 100a are different.

In some embodiments, in one of the at least one unit region 100, the grooves 101 of various unit sub-regions 100a have different the sums of the depths and/or different widths, and/or various unit sub-regions 100a have different pore densities, such that the various unit sub-regions 100a have different porosities.

FIG. 15 is a cross-sectional schematic structural diagram of a substrate according to a sixth embodiment of the present disclosure. FIG. 16 is a flowchart of a method for manufacturing the substrate in FIG. 15.

With reference to FIG. 15 and FIG. 16, the substrate and the manufacturing method therefor in the sixth embodiment are completely the same as the substrate in the semiconductor structure and the manufacturing method therefor in the fifth embodiment. That is, the substrate in the semiconductor structure and the manufacturing method therefor in the fifth embodiment are introduced into the sixth embodiment in entirety. The substrate 10 in the semiconductor structure in the fifth embodiment may be manufactured and marketed separately.

In some embodiments, in one of the at least one unit region 100, grooves 101 of some unit sub-regions 100a may further be provided on a front surface 10a or a back surface 10b of a premanufactured substrate 10', grooves 101 of some unit sub-regions 100a are provided on the front surface 10a and the back surface 10b of the premanufactured substrate 10', and the grooves 101 of various unit sub-regions 100a have different depths or sums of the depths and/or different widths, and/or various unit sub-regions 100a have different pore densities, such that the various unit sub-regions 100a have different porosities. In other words, in one of at least one unit region 11 of the substrate 10, the self-healing layers 102 of some unit sub-regions 100a are coupled to a front surface 10a or a back surface 10b of the substrate 10, and the self-healing layers 102 of some unit sub-regions 100a are coupled to the front surface 10a and the back surface 10b of the substrate 10. The gaps 101a of various unit sub-regions 100a have different depths or sums of the depths and/or different widths, and/or various unit sub-regions 100a have different pore densities, such that the various unit sub-regions 100a have different porosities.

Figure 17:
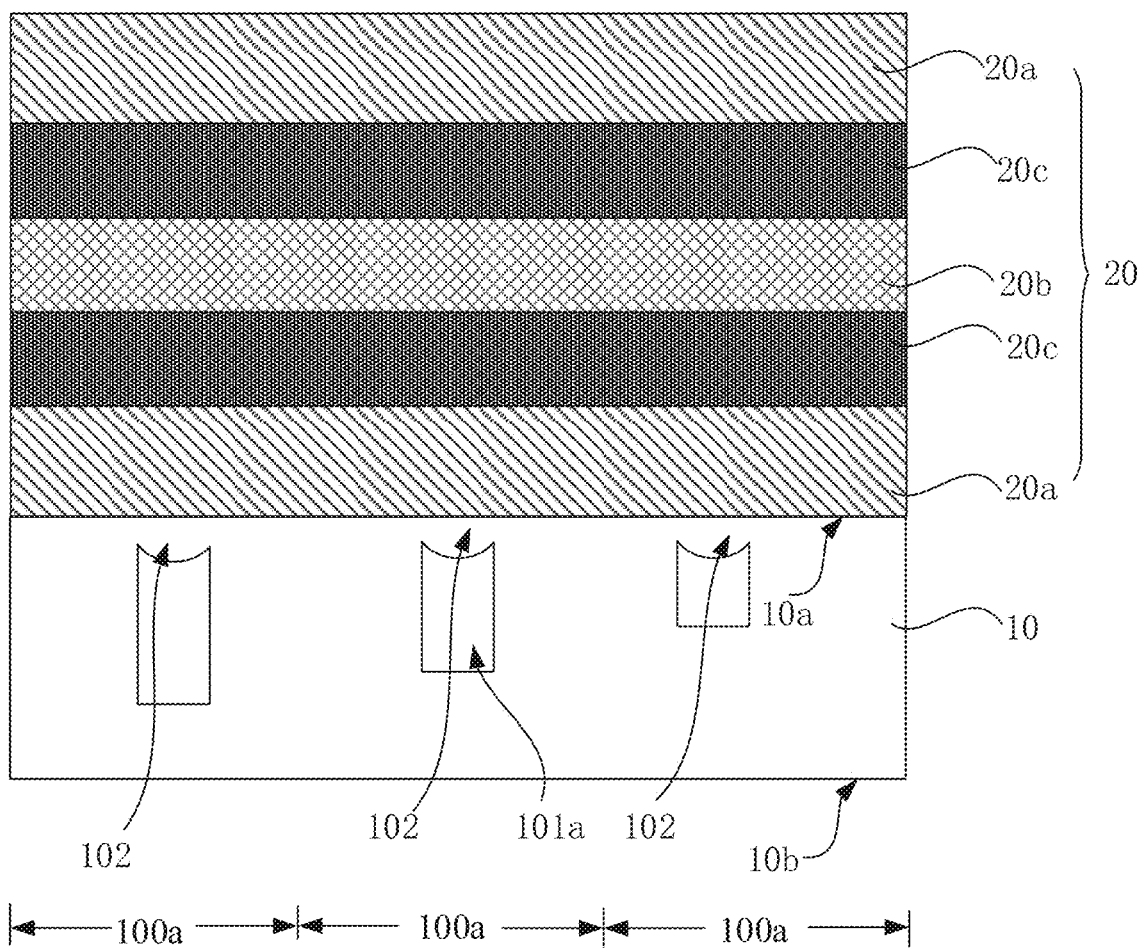
FIG. 17 is a cross-sectional schematic structural diagram of a semiconductor structure according to a seventh embodiment of the present disclosure.

FIG. 17 is a cross-sectional schematic structural diagram of a semiconductor structure according to a seventh embodiment of the present disclosure.

With reference to FIG. 17, the method for manufacturing the semiconductor structure in the seventh embodiment and the methods in the first embodiment, the third embodiment, the fifth embodiment are substantially the same and only differ in that at step S2, the grown light-emitting layer 20 includes multiple N-type semiconductor layers 20a and multiple P-type semiconductor layers 20b, where the multiple N-type semiconductor layers 20a and the multiple P-type semiconductor layers 20b are disposed alternately, and multi-quantum well material layers 20c are respectively disposed between each of the N-type semiconductor layers 20a and the P-type semiconductor layers 20b adjacent to the N-type semiconductor layers 20a.

Comparing with the semiconductor structures in the first embodiment, the third embodiment, and the fifth embodiment, the semiconductor structure in the seventh embodiment can improve light-emitting efficiency of the light-emitting layer 20.

In the present disclosure, the term "at least one" means one, two, or more than two, unless otherwise specified.

The foregoing discloses the present disclosure, but does not limit the present disclosure. Any person skilled in the art can make various variations and modifications without departing from the spirit and scope of the present disclosure. Therefore, the protection scope of the present disclosure should subject to the scope defined by the claims.

The invention claimed is:

1. A substrate, comprising:
   at least one unit region, wherein each of the at least one unit region comprises at least two unit sub-regions, each of the at least two unit sub-regions has at least one gap and at least one self-healing layer for closing the at least one gap; and in one of the at least one unit region, the at least two unit sub-regions respectively have different porosities.

2. The substrate according to claim 1, wherein in the one of the at least one unit region,
   one or more of: (a) the at least one gap in each of the at least two unit sub-regions respectively has different depths and/or different widths, or
   (b) the at least two unit sub-regions respectively have different pore densities.

3. The substrate according to claim 1, wherein the at least one self-healing layer is coupled to a front surface or a back surface of the substrate.

4. The substrate according to claim 1, wherein the at least one self-healing layer is coupled to a front surface and a back surface of the substrate.

5. The substrate according to claim 1, wherein in the one of the at least one unit region,
   the self-healing layers of some of the at least two unit sub-regions are coupled to a front surface or a back surface of the substrate; and
   the self-healing layers of some of the at least two unit sub-regions are coupled to the front surface and the back surface of the substrate.

6. The substrate according to claim 1, wherein the substrate is a patterned substrate.

7. The substrate according to claim 1, wherein a material of the substrate is at least one of sapphire, silicon, silicon carbide, or a GaN-based material.

8. A semiconductor structure, comprising:
the substrate according to claim 1; and
a light-emitting layer disposed on a front surface of the substrate, wherein in the one of the at least one unit region, a light-emitting wavelength of the light-emitting layer for each of the at least two unit sub-regions differs.

9. The semiconductor structure according to claim 8, wherein the light-emitting layer comprises:
an N-type semiconductor layer,
a P-type semiconductor layer, and
a multi-quantum well material layer disposed between the N-type semiconductor layer and the P-type semiconductor layer.

10. The semiconductor structure according to claim 8, wherein the light-emitting layer comprises multiple N-type semiconductor layers and multiple P-type semiconductor layers, wherein the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

11. The semiconductor structure according to claim 8, wherein the semiconductor structure is used for display; and the light-emitting layer of each of the at least one unit region forms a light-emitting unit.

12. A method for manufacturing a substrate, comprising:
providing a premanufactured substrate, wherein the premanufactured substrate comprises at least one unit region, and each of the at least one unit region comprises at least two unit sub-regions;
providing at least one groove in each of the at least two unit sub-regions on a surface of the premanufactured substrate, wherein in one of the at least one unit region, the at least two unit sub-regions respectively have different porosities; and
annealing the premanufactured substrate to form a substrate, wherein openings of the grooves are healed to form self-healing layers, and the grooves that are not fully healed form gaps.

13. The method for manufacturing a substrate according to claim 12, wherein in the one of the at least one unit region, one or more of: (a) the at least one groove in each of the at least two unit sub-regions respectively has different depths and/or different widths, or
(b) the at least two unit sub-regions respectively have different pore densities.

14. The method for manufacturing a substrate according to claim 12, wherein the at least one groove is provided in each of the unit sub-regions on a front surface or a back surface of the premanufactured substrate.

15. The method for manufacturing a substrate according to claim 12, wherein the at least one groove is provided in each of the unit sub-regions on a front surface and a back surface of the premanufactured substrate.

16. The method for manufacturing a substrate according to claim 12, wherein a width of each of the at least one groove is less than 100 μm.

17. A method for manufacturing a semiconductor structure, comprising:
manufacturing a substrate by the method according to claim 12; and
growing a light-emitting layer on a front surface of the substrate, wherein in one of the at least one unit region, a light-emitting wavelength of the light-emitting layer for each of the at least two unit sub-regions differs.

18. The method for manufacturing a semiconductor structure according to claim 16, wherein the light-emitting layer comprises:
an N-type semiconductor layer,
a P-type semiconductor layer, and
a multi-quantum well material layer disposed between the N-type semiconductor layer and the P-type semiconductor layer.

19. The method for manufacturing a semiconductor structure according to claim 16, wherein the light-emitting layer comprises multiple N-type semiconductor layers and multiple P-type semiconductor layers, wherein the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

20. The method for manufacturing a semiconductor structure according to claim 17, wherein a forbidden bandwidth of the multi-quantum well material layer increases along with the rise of a growth temperature; wherein in the one of the at least one unit region, the greater the porosity of the unit sub-region is, the longer the light-emitting wavelength of the corresponding light-emitting layer is; and the smaller the porosity of the unit sub-region is, the shorter the light-emitting wavelength of the corresponding light-emitting layer is.

* * * * *